United States Patent
Shimada et al.

(10) Patent No.: US 6,376,833 B2
(45) Date of Patent: *Apr. 23, 2002

(54) PROJECTION HAVING A MICRO-APERTURE, PROBE OR MULTI-PROBE HAVING SUCH A PROJECTION AND SURFACE SCANNER, ALIGNER OR INFORMATION PROCESSOR COMPRISING SUCH A PROBE

(75) Inventors: Yasuhiro Shimada, Hadano; Takeo Yamazaki, Yokohama, both of (JP)

(73) Assignee: Canon Kabushiki Kaisha, Tokyo (JP)

( * ) Notice: This patent issued on a continued prosecution application filed under 37 CFR 1.53(d), and is subject to the twenty year patent term provisions of 35 U.S.C. 154(a)(2).

Subject to any disclaimer, the term of this patent is extended or adjusted under 35 U.S.C. 154(b) by 0 days.

(21) Appl. No.: 09/139,401

(22) Filed: Aug. 25, 1998

(30) Foreign Application Priority Data

Aug. 26, 1997 (JP) .............................................. 9-244807

(51) Int. Cl.[7] .................................................. H01J 3/14
(52) U.S. Cl. .......................... 250/234; 250/306; 216/11
(58) Field of Search ................................. 250/234, 306, 250/307, 216, 201.3; 205/122; 216/11, 41; 438/20, 735

(56) References Cited

U.S. PATENT DOCUMENTS

| 4,943,343 A | * | 7/1990 | Bardai et al. ................. 438/20 |
| 5,294,790 A | * | 3/1994 | Ohta et al. ................... 250/216 |
| 5,888,371 A | * | 3/1999 | Quate ........................ 205/122 |
| 5,929,438 A | * | 7/1999 | Suzuki et al. ................ 250/306 |

FOREIGN PATENT DOCUMENTS

| EP | 0112402 A1 | 7/1984 |
| JP | 02-098849 | 4/1990 |
| JP | 04-090152 | 3/1992 |
| JP | 06-084455 | 3/1994 |

OTHER PUBLICATIONS

U. Dürig. et al., "Near–field Optical–Scanning Microscopy", Journal of Applied Physics, 1986, vol. 59, pp. 3318–3327.

R.C. Reddick, et al. "New Form of Scanning Optical Microscopy", Physical Review B Condensed Matter, 1989, vol. 39, pp. 767–770.

G. Benning, et al., "Surface Studies by Scanning Tunneling Microscopy", 1982, Physical Review Letter, vol. 49, pp. 57–61.

* cited by examiner

*Primary Examiner*—Que T. Le
*Assistant Examiner*—Thanh X Luu
(74) *Attorney, Agent, or Firm*—Fitzpatrick, Cella, Harper & Scinto

(57) ABSTRACT

A projection having a micro-aperture on the tip is formed. Firstly, a projection or a dent is formed on a substrate. Then, a film is formed on the surface of the projection or of the opposite side of the dent so as to make the film thin at and near the tip of the projection or the dent. The film is subsequently etched to expose the tip, which is further etched to produce a micro-aperture. Preferably, the film is formed of a thermo-plastic material such as glass, especially phospho-silicate glass to produce a viscous flow under heated conditions. The probe having a micro-aperture can be used for a surface scanner, an aligner or an information processor.

8 Claims, 7 Drawing Sheets

PROJECTION HAVING A MICRO-APERTURE, PROBE OR MULTI-PROBE HAVING SUCH A PROJECTION AND SURFACE SCANNER, ALIGNER OR INFORMATION PROCESSOR COMPRISING SUCH A PROBE

BACKGROUND OF THE INVENTION

1. Field of the Invention

This invention relates to a method of forming a micro-aperture. It also relates to a projection having such a micro-aperture, to a probe or multi-probe having such a projection or projections and also to a surface scanner (surface-observing system), an aligner (exposure system) or an information processor comprising such a probe. More particularly, the present invention relates to a method of manufacturing a micro-tip for detecting or irradiating evanescent light to be used for a near-field optical microscope and to a probe having such a micro-tip.

2. Related Background Art

The invention of the scanning tunneling microscope (hereinafter referred to as STM) made it possible to visually observe the electron structure of surface atoms of an electric conductor [G. Binnig et al., Phys. Rev. Lett. 49, 57 (1982)] and hence a real space image of a specimen to be dimensionally measured with an enhanced degree of resolution regardless if the specimen is monocrystalline or noncrystalline. Since then, research efforts have been paid on the scanning probe microscope (hereinafter referred to as SPM) particularly in an attempt to look into the micro-structures of various materials.

SPMs include scanning tunneling microscopes (STMs), atomic force microscopes (AFMs) and magnetic force microscope (MFMs) that are adapted to detect the surface structure of a specimen by means of a tunneling current, an atomic force, a magnetic force or a beam of light produced when a probe having a micro-tip is brought very close to the specimen.

The scanning near-field optical microscope (hereinafter referred to as SNOM) has been developed from the STM. It can be used to examine the surface of a specimen by detecting evanescent light seeping out from the micro-aperture arranged at the sharp tip of the probe of the microscope by means of an optical probe from the surface of the specimen [Durig et al., J. Appl. Phys. 59, 3318 (1986)].

The photon STM (hereinafter referred to as PSTM) is a type of SNOM and adapted to examine the surface of a specimen by introducing a beam of light into the specimen from the backside through a prism, making the beam totally reflected by the surface of the specimen, and then detecting evanescent light seeping out from the surface of the specimen by means of an optical probe [Reddick et al., Phys. Rev. B39, 767 (1989)].

Since the resolution of an SNOM is determined as a function of the tip diameter of the optical probe, the surface of the probe is shielded against light and is typically provided with a micro-aperture at the tip thereof in an SMOM so that light may come out only through the small exit.

A number of techniques have been proposed to produce a micro-aperture. According to a proposed technique, a micro-aperture is formed by coating the intersection of cleaved planes of a transparent crystal with metal and then removing the metal from the intersection by pressing the metal-coated crossing against a very hard surface (see FIG. 1A) (European Patent EP0112402).

According to another proposed technique, a micro-aperture is formed by depositing metal on the micro-tip by evaporation only from a given direction, while rotating the optical fiber probe, to produce an area carrying no metal deposit on it (see FIG. 1B).

However, in the latter case, a micro-aperture is formed on an optical fiber probe on a one by one basis. Also, the process of forming a micro-aperture in any of the known techniques will inevitably show a poor productivity and it is difficult to realize a process that can produce a number of micro-apertures in an integrated manner.

Additionally, the known techniques are accompanied by the difficulty of precisely controlling the diameter of the micro-aperture to ensure a reliable degree of reproducibility.

SUMMARY OF THE INVENTION

In view of the above identified technological problems, it is therefore an object of the present invention to provide a method of forming a micro-aperture or micro-apertures, easily integrated on a substrate, with an enhanced degree of reproducibility, the method minimizing the variances in the diameter of the micro-apertures and achieving a high productivity in batch processes. Another object of the present invention is to provide a projection having such a micro-aperture. Still another object of the present invention is to provide a probe or a multi-probe having such a projection or projections. Still another object of the invention is to provide a surface scanner, an aligner or an information processor using such a probe.

According to a first aspect of the invention, the above first object is achieved by providing a method of forming a micro-aperture comprising steps of:

forming a projection or a dent on a substrate;

forming a film on the surface of said projection or of the opposite side of said dent so as to make the film thin at and near the tip of said projection or said dent;

etching said film to expose said tip; and producing a micro-aperture by etching the exposed tip.

The remaining objects of the invention are achieved by providing a projection having a micro-aperture formed by the above described method, a probe having such a projection, a multi-probe having such projections formed on a substrate and a surface scanner, an aligner or an information processor comprising such a probe or a multi-probe.

DESCRIPTION OF THE PREFERRED EMBODIMENTS

Figure 1A:
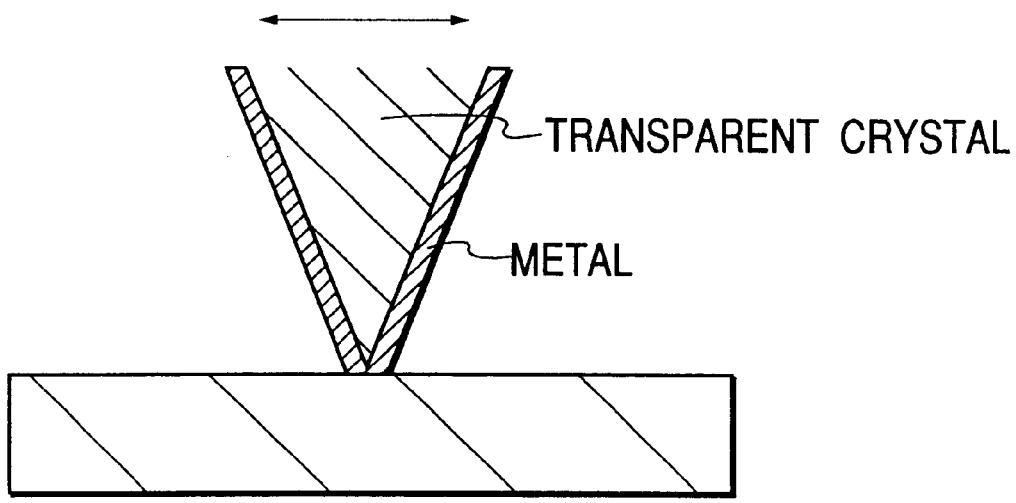
FIGS. 1A and 1B are schematic cross sectional views of two different probes having a micro-aperture, illustrating respective known methods of forming such probes.
Figure 1B:
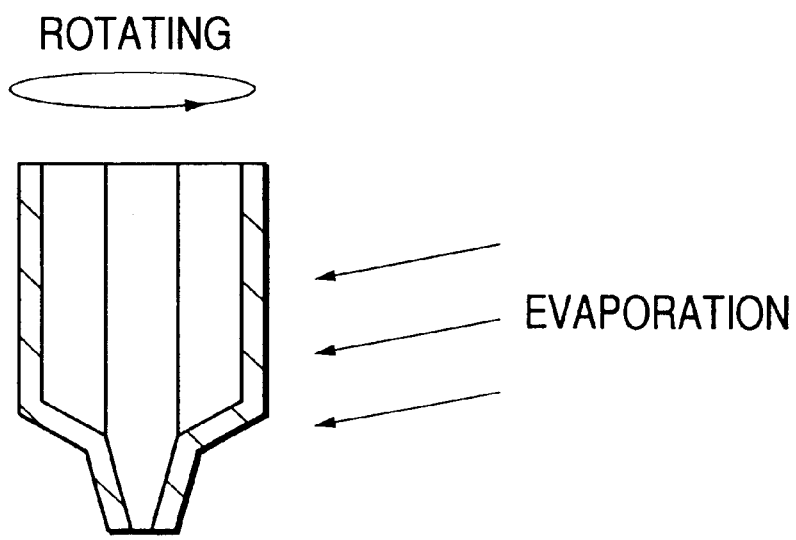

A projection having a micro-aperture according to the invention is designed to detect or irradiate evanescent light.

Now, a method of forming a projection having a micro-aperture will be described.

Firstly, a projection of thin film is formed on a substrate. The thin film operates as a light blocking layer. Japanese Patent Application Laid-Open No. 6-084455 describes a known method of forming a projection of thin film. According to the patent document, a dent that operates as mold for forming a projection is formed in a first substrate and then a peelable layer is formed thereon. Thereafter, a thin film layer is formed thereon and transferred onto a second substrate having a bonding layer to produce a projection of thin film.

According to another known method, a projection is produced by forming a thin film layer on a substrate having a dent that operates as mold for forming the projection and selectively etching the substrate from the back side.

Such a dent is preferably formed by crystal-axis-anisotropic etching because it provides a high profile reproducibility. The surface of a projection formed by depositing or etching a light transmitting material may be coated by a light blocking layer. Alternatively, a light blocking layer may be formed on the surface of a projection of a sacrificial layer. A projection of light blocking thin film is produced when the sacrificial layer is removed. The light blocking layer is preferably made of a metal having a high reflectivity, although any other material may be used depending on the application.

Secondly, a film thickness controlling layer is formed on the side of the substrate that carries the projection thereon.

The film thickness controlling layer is made of a thermoplastic material that can produce a viscous flow. Then, the film thickness of the plastic material will be reduced at the tip of the projection from that of the surrounding area by controlling the film forming condition or heat-treating the film after formed.

A thermoplastic material that can preferably be used for the purpose of the invention is glass that reflows but hardly reacts with the material of the probe to be formed. A glass layer is preferably formed by chemical vapor deposition (CVD) using an organic silicon source gas of organic tetraethylorthosilicate (TEOS) or diethylsilane because the produced glass layer shows a uniform thickness and can be reproduced at relatively low temperature.

A glass layer of phospho-silicate glass (PSG), boro-silicate glass (BSG) or boro-phospho-silicate glass (BPSG) can be produced by doping the source gas with trimethylborate (TMB) or trimethylphosphate (TMP). The use of PSG is particularly preferable because the glass layer can be formed at relatively low temperature of about 400° C. or less.

For the purpose of the invention, the method of forming a layer of a plastic material is not limited to the above listed ones so long as the surface profile of the substrate is faithfully reproduced. Other techniques that can be used for the purpose of the invention include vacuum evaporation, sputtering, chemical vapor phase growth, spin coating and dip coating. The step of forming and heat-treating a plastic material is based on the established technology of producing semiconductor ICs and hence shows an enhanced level of reproducibility. A thin film obtained by spin coating resist can also be used as film thickness controlling layer for the purpose of the invention because the technique is also adapted to produce a thin film with a uniform thickness.

Thirdly, a micro-aperture is formed. More specifically, the tip of the projection having a small film thickness becomes exposed firstly when the film thickness controlling layer is isotropically etched. Then, a micro-aperture is formed when the tip of the exposed projection (light blocking layer) is etched.

The above described method of forming a micro-aperture provides the advantage of reproducing the profile of the projection (light blocking layer) typically by means of crystal-anisotropic etching. The distribution of film thickness of the thermoplastic material is determined by the heat treatment conditions and the diameter of the micro-aperture is determined by the dry etching conditions.

The above described method is particularly adapted to reproduce micro-apertures because the error in the diameter of the micro-apertures formed by a method according to the invention is very small. Additionally, the variance in the diameter of a plurality of micro-apertures formed on a substrate can be minimized with the above described method.

The present invention provides not only a method of forming a micro-aperture and a projection having such a micro-aperture but also a probe or a multi-probe having a projection or projections as well as a surface scanner, an aligner or an information processor comprising such a probe or a multi-probe.

The surface of a specimen can be observed by arranging a probe according to the invention close to the specimen, two-dimensionally and intra-planarly scanning the surface of the specimen by means of an x-y actuator and detecting evanescent light seeping out from the surface of the specimen.

It is possible to prepare an aligner that can produce a micro-pattern that is dimensionally more minute than the wavelength of light by exposing resist to light by means of a probe according to the invention.

It is also possible to prepare an information recording/reproducing apparatus adapted to change the surface state of a micro-region of a recording medium and observing it by means of a probe according to the invention. SNOM signals can be used for controlling the distance and the contact force between the specimen and the recording medium.

STM techniques and techniques using shearing force may be applied to the present invention without limiting the scope of the present invention. It is also possible to provide a surface scanner, an aligner or an information recording/reproducing apparatus having a large data transfer rate by using a multi-probe according to the invention in order to process data in parallel. A recording medium adapted to change its optical characteristics when a voltage is applied thereto may typically be made of 10, 12-pentacosadiynoic acid that gives rise to a structural change in the diacetylene derivative polymer to shift the peak wavelength of the light absorption band due to the Joule's heat produced by the local electric current generated as a result of the voltage application as described in Japanese Patent Application Laid Open No. 4-90152.

A recording medium adapted to change its optical characteristics when a voltage is applied thereto while irradiating it with light may typically be made of an azo compound having a quinone radical or a hydroquinone radical that gives rise to a cis-trans photo-isomerizing reaction to form a redox pair only when irradiated with light so that protons migrate between the redox pair if an electric field is applied thereto as described in Japanese Patent Application Laid-Open No. 2-98849.

Now, the present invention will be described in greater detail by way of examples.

Example 1

Figure 3A:
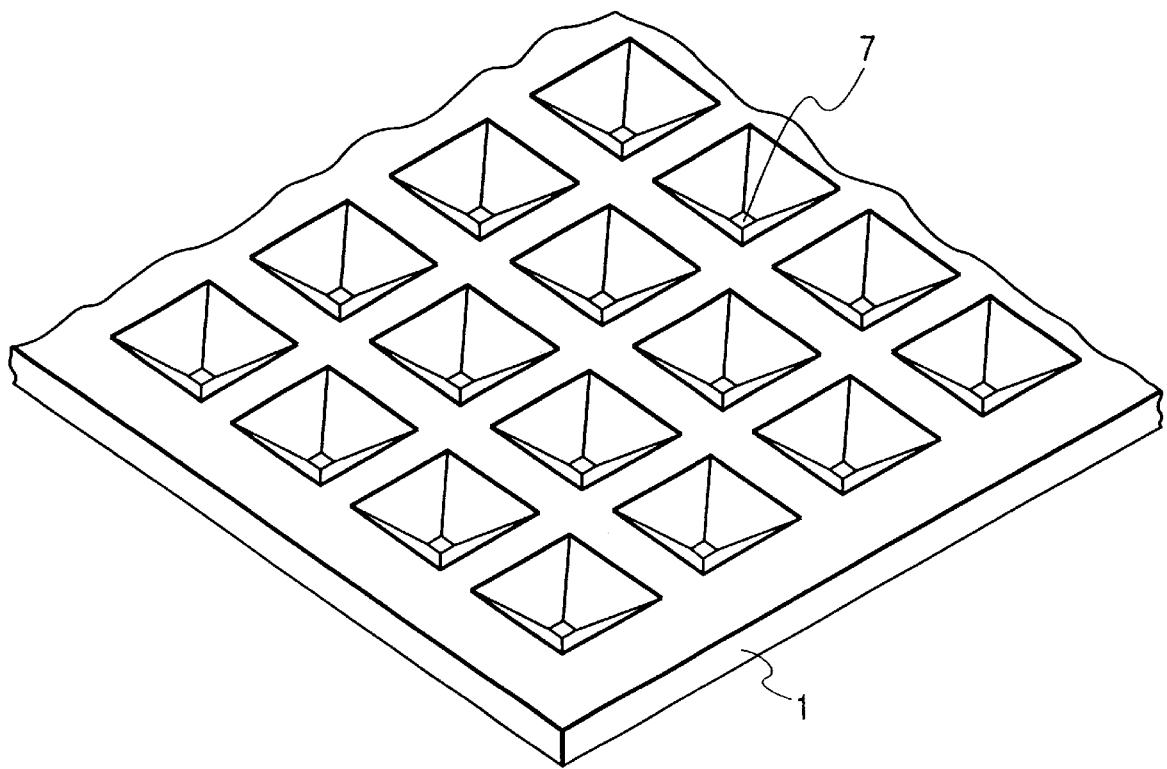
FIGS. 3A and 3B are a schematic perspective view and a schematic cross sectional view of the micro-apertures of Example 1.
Figure 3B:
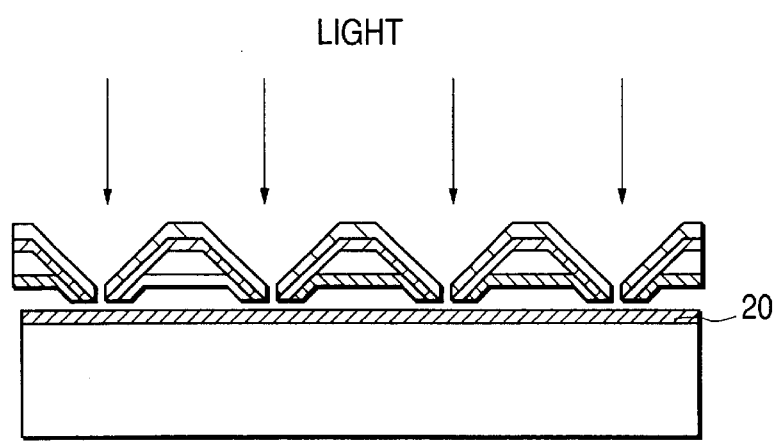

Example 1 relates to an array of 100 micro-apertures arranged in the form of a 10×10 matrix on a silicon substrate (see FIG. 3A) and a method of forming the array. An array of micro-apertures as prepared in Example 1 may typically be used to expose a sheet of photoresist to light to produce a micro-pattern by irradiating light from the side opposite to the side where the micro-apertures are arranged, while holding the photoresist so close to the micro-apertures as to make it exposed to evanescent light coming from the micro-apertures.

FIGS. 2A through 2H are schematic cross sectional views of an array of micro-apertures prepared in Example 1, showing different preparation steps as is will be described hereinafter.

A thermally oxidized silicon oxide film was formed to a thickness of 100 nm as protective layer 2 on a single crystal silicon wafer substrate 1 having a crystal plane of (100). Then, the protective layer 2 was patterned to expose the silicon by 50 μm square by photolithography and etching using an aqueous solution of hydrogen fluoride and ammonium fluoride. Thereafter, the exposed silicon was etched by crystal-axis-anisotropic etching using a 30% aqueous solution of potassium hydroxide at 90° C. As a result of the above step, dents 3 having a profile of inverted pyramid and defined by four surfaces equivalent to (111) planes were produced to show a depth of about 35 μm (see FIG. 2A).

Figure 2A:
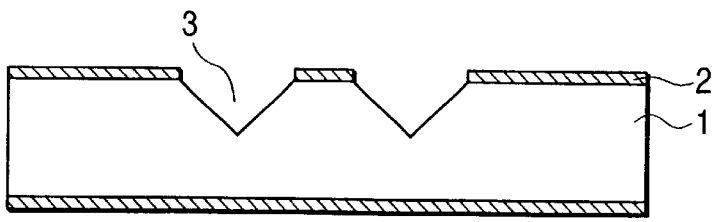
FIGS. 2A, 2B, 2C, 2D, 2E, 2F, 2G and 2H are schematic cross sectional views of micro-apertures according to the invention and prepared in Example 1, showing different steps of forming micro-apertures.
Figure 2B:
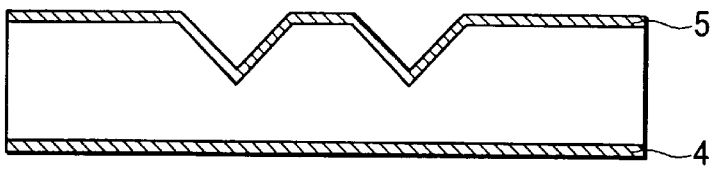

Subsequently, the protective layer 2 was removed by means of an aqueous solution of hydrogen fluoride and ammonium fluoride and then a rear surface mask layer 4 and an etch-stop layer 5 were formed to a thickness of 200 nm by low pressure chemical vapor growth of silicon nitride film (see FIG. 2B).

Thereafter, the rear surface mask layer 4 was patterned to partly expose the silicon by photolithography and dry etching using carbon tetrafluoride.

Then, the exposed silicon was etched by crystal-axis-anisotropic etching using a 30% aqueous solution of potassium hydroxide at 110° C. As a result of this etching step, the tops of the etch-stop layer 5 of the dents 3 became exposed (see FIG. 2C).

Thereafter, a film thickness controlling layer of SOG (spin-on-glass) was produced by forming a polysiloxane film in a sol state by spin coating and heat treating it at 300° C. (see FIG. 2D). Then, the film thickness controlling layer 6 was plastically deformed through heat treatment at 400° C. for 20 minutes to produce a film thickness distribution where the SOG was thinned at the tops (see FIG. 2E).

Subsequently, the film thickness controlling layer 6 and the etch-stop layer 5 were etched to produce micro-apertures 7 at the tops of the etch-stop layer 5 by dry etching using carbon tetrafluoride (see FIG. 2F).

Figure 2C:
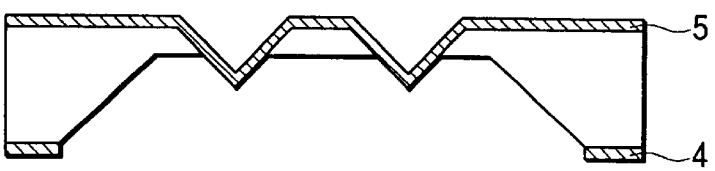
Figure 2D:
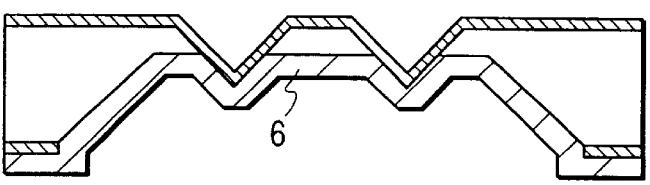
Figure 2E:
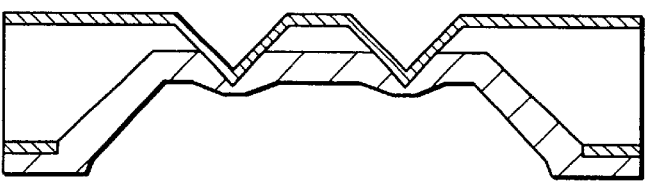
Figure 2F:
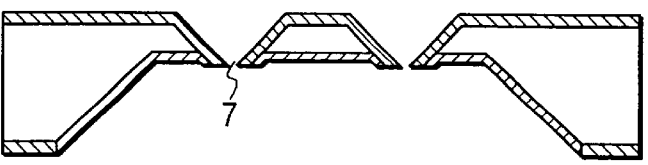
Figure 2G:
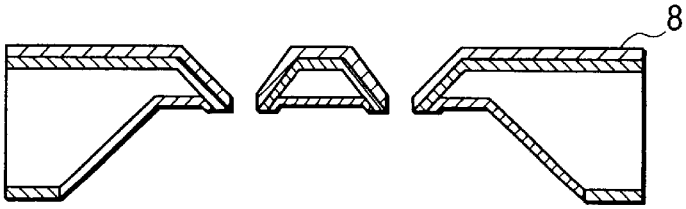
Figure 2H:
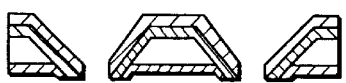

Then, a gold (Au) layer was formed as light blocking layer 8 on the surface of the substrate 1 to a thickness of 100 nm by vacuum evaporation (see FIG. 2G).

Finally, the product was diced by means of a substrate cutter to produce a finished chip having an array of micro-apertures.

The method of this example is advantageous in that the diameter of the micro-apertures does not rely on the timing of stopping the etching operation in the step of FIG. 2C and determined by the film thickness, the heat treatment conditions and the dry etching conditions of the film thickness controlling layer 6 so that micro-apertures can be produced with an enhanced degree of reproducibility without controlling the timing of stopping the etching operation that has been and still is a task difficult to achieve.

When a plurality of micro-apertures are formed on a substrate, they show a substantially identical diameter because the diameter simply depends on the profile of the tips of the dents 3 and is not affected by the variance in the thickness of the substrate and the etching rate of the substrate. When the prepared micro-tips were observed through an SEM, the micro-apertures showed an oblong contour having a short edge of 20 nm±5 nm.

Example 2

This example relates to an optical probe formed on a substrate comprising a projection having a micro-aperture at the tip thereof.

Figure 5A:
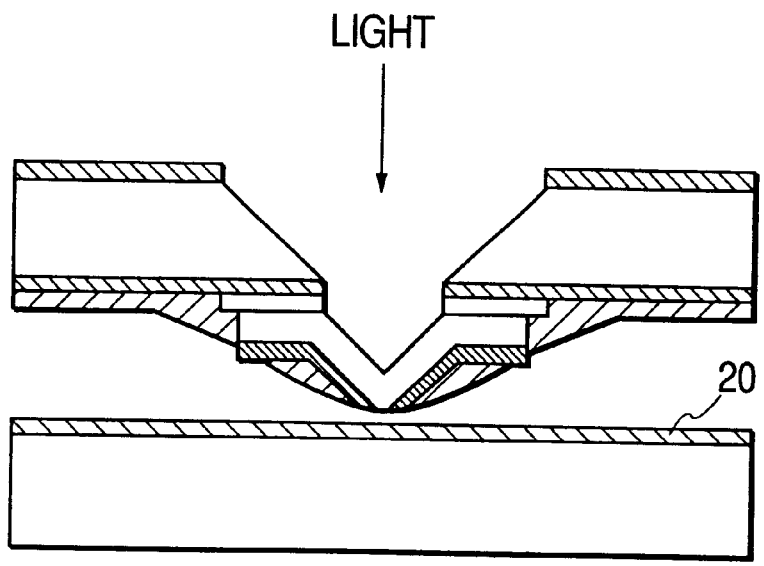
FIGS. 5A and 5B are schematic cross sectional views of the probe having a micro-aperture of Example 2.

A probe as prepared in Example 2 may typically be used to change the state of the surface of a micro-area of photoresist 20 by introducing light from the back side of the probe and irradiating the micro-area with evanescent light through the micro-aperture of the probe (see FIG. 5A).

Figure 5B:
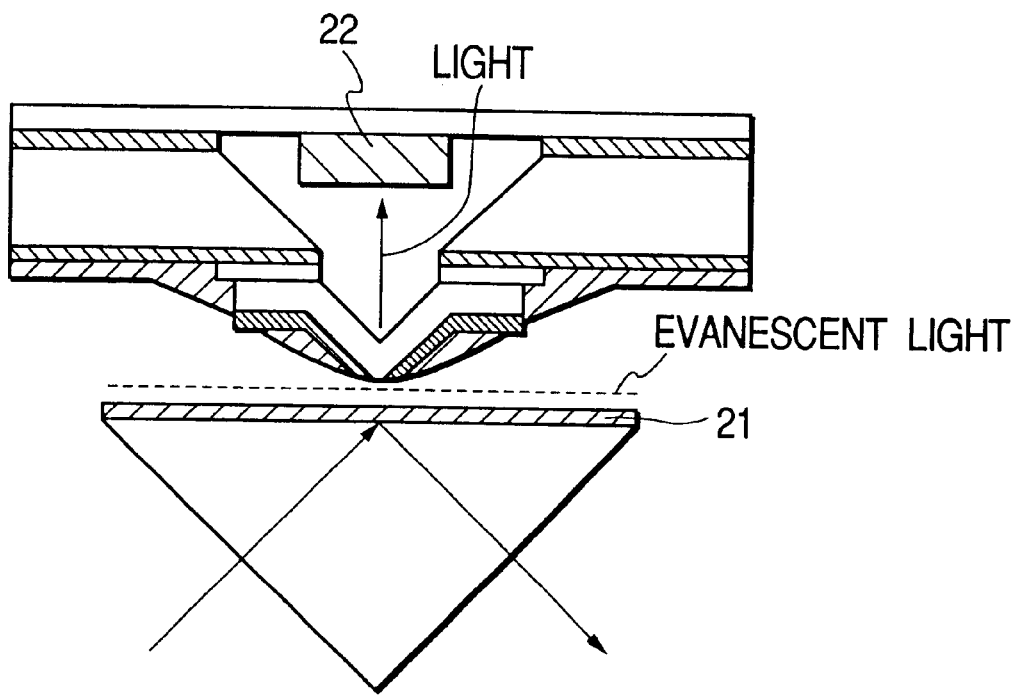

It may also be combined with a light receiving device 22 and used in a microscope for detecting light in a near field (see FIG. 5B).

FIGS. 4A through 4F are schematic cross sectional views of an optical probe having a micro-aperture prepared in Example 2, showing different preparation steps. Now, the process of forming an optical probe having a micro-aperture will be described by referring to FIGS. 4A through 4F.

A thermally oxidized silicon oxide film was formed to a thickness of 100 nm as protective layer on a single crystal silicon wafer first substrate 11 having a crystal plane of (100).

Then, the protective layer was patterned to expose the silicon by 10 μm square by photolithography and etching using an aqueous solution of hydrogen fluoride and ammonium fluoride.

Thereafter, the exposed silicon was etched by crystal-axis-anisotropic etching using a 30% aqueous solution of potassium hydroxide at 90° C. As a result of the above step, a dent having a profile of inverted pyramid and defined by four surfaces equivalent to (111) planes were produced to show a depth of about 7 μm.

Subsequently, the protective layer was removed by means of an aqueous solution of hydrogen fluoride and ammonium fluoride and then a silicon nitride film was formed to a thickness of 200 nm by low pressure chemical vapor phase growth as peeling layer 13.

Then, gold and tungsten were deposited by sputtering as light blocking layer 8 to respective thicknesses of 5 nm and 100 nm and silicon dioxide was deposited also by sputtering as light transmitting layer 9 to a thickness of 300 nm. Subsequently, the layers were subjected to a patterning operation (see FIG. 4A).

A silicon nitride film was formed to a thickness of 200 nm as protective layer on a single crystal silicon wafer second substrate 12 having a crystal plane of (100). Thereafter, a polyimde film was formed as bonding layer 14 and then subjected to a patterning operation. Subsequently, the protective layer on the rear side was patterned into an intended pattern by photolithography and etching using an aqueous solution of hydrogen fluoride and ammonium fluoride and then the second substrate 12 and the surface protective layer were etched from the back side to produce a through hole (see FIG. 4B).

Then, the first substrate 11 and the second substrate 12 were bonded to each other along the interface of the bonding layer 14 and the light transmitting layer 9 by holding the two substrates together and heat treating them at 200° C. (see FIG. 4C). Subsequently, the first substrate 11 and the second substrate 12 were separated from each other by peeling them off from each other along the interface of the peeling layer 13 and the light blocking layer 8 in order to transfer the projection onto the second substrate 12.

Figure 4A:
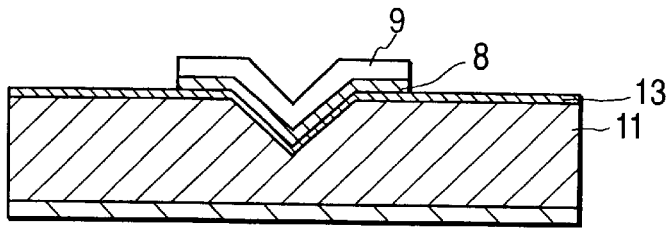
FIGS. 4A, 4B, 4C, 4D, 4E and 4F are schematic cross sectional views of a probe having a micro-aperture according to the invention and prepared in Example 2, showing different steps of forming a micro-aperture.
Figure 4B:
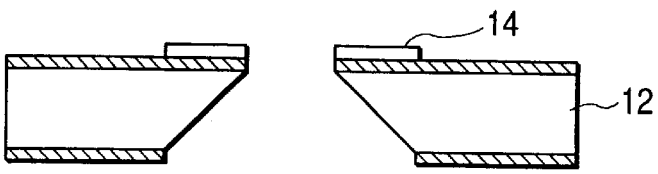
Figure 4C:
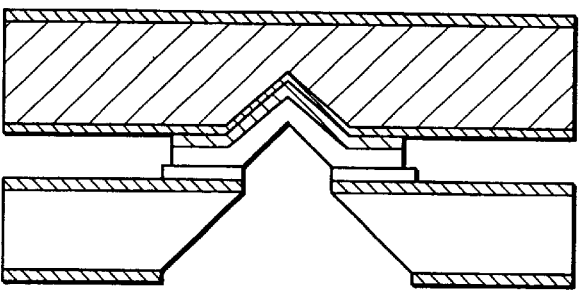
Figure 4D:
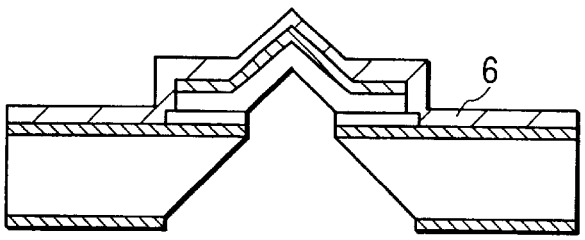
Figure 4E:
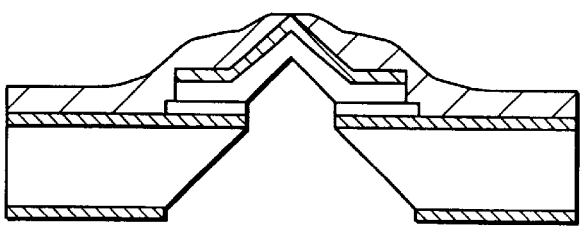
Figure 4F:
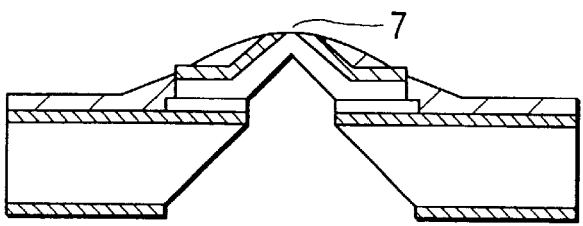

Thereafter, a film thickness controlling layer 6 was produced with a film thickness of 100 nm by forming a PSG film from the surface of the first substrate 11 at film forming temperature of 350° C. by chemical vapor deposition using TEOS (tetraethylorthosilicate), TMP (trimethylphosphate) and ozone (see FIG. 4D). Then, the film thickness controlling layer 6 was plastically deformed through heat treatment at 500° C. for 20 minutes to produce a film thickness distribution where the PSG was thinned at the top (see FIG. 4E). Subsequently, the film thickness controlling layer 6 and the light blocking layer 8 were etched to produce a micro-aperture 7 at the top of the light blocking layer 8 by dry etching using carbon tetrafluoride (see FIG. 4F).

As a result, a projection having a micro-aperture with a diameter smaller than the diameters of any micro-apertures that can be produced by known methods was formed with an enhanced degree or reproducibility.

An SNOM image could be obtained with a high resolution by means of a surface scanner comprising a probe prepared by this example.

Example 3

Figure 7:
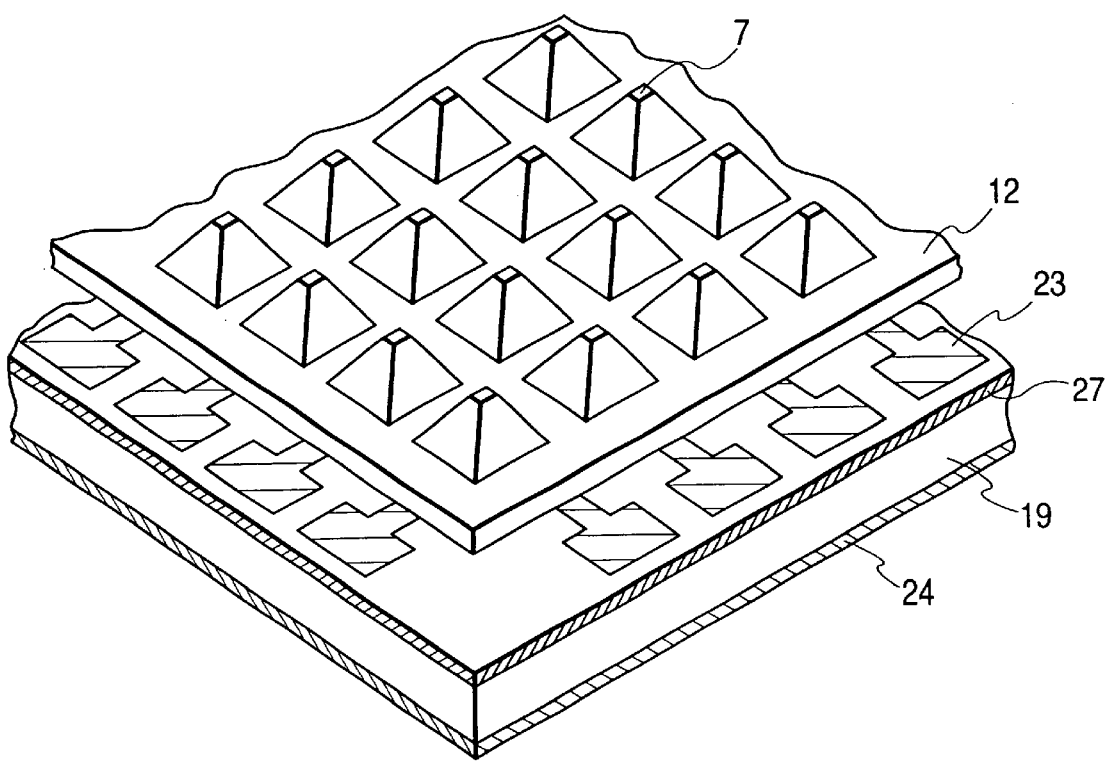
FIG. 7 is a schematic perspective view of the multi-probe having micro-apertures of Example 3.

Example 3 relates to an optical multi-probe having an array of 100 optical probes, each having a projection and a micro-aperture at the top of the projection, arranged in the form of a 10×10 matrix on a substrate (see FIG. 7).

Each of the optical probes is provided with a light emitting device that is a surface emitting laser and wiring electrodes for driving it. An optical multi-probe as prepared in Example 3 may typically be used to change the state of the surface of a micro-area of photoresist by irradiating it with near-field light from each of the probes.

The rate of forming micro-patterns can be improved by intra-planarly scanning photoresist, turning on and off each of the probes in a controlled manner. While each probe having a micro-aperture is combined with a light emitting device in the example, the multi-probe may be combined with light receiving devices such as avalanche photodiodes to produce a multi-light-receiving device unit.

FIGS. 6A through 6E are schematic cross sectional views of an optical multi-probe according to the invention and prepared in Example 3, showing different preparation steps as will be described hereinafter.

A thermally oxidized silicon oxide film was formed to a thickness of 100 nm as protective layer on a monocrystalline silicon wafer substrate 11 having a crystal plane of (100) as in Example 1. Then, the protective layer was patterned to expose the silicon by 10 μm square by photolithography and etching using an aqueous solution of hydrogen fluoride and ammonium fluoride. Thereafter, the exposed silicon was etched by crystal-axis-anisotropic etching using a 30% aqueous solution of potassium hydroxide at 90° C. As a result of the above step, dents 3 having a profile of inverted pyramid and defined by four surfaces equivalent to (111) planes were produced to show a depth of about 7 μm (see FIG. 2A). Subsequently, the protective layer 2 (see FIG. 2A) was removed by means of an aqueous solution of hydrogen fluoride and ammonium fluoride and then a peeling layer 13 was formed to a thickness of 200 nm by low pressure chemical vapor growth of silicon nitride film. Then, gold and tungsten were deposited by sputtering as light blocking layer 8 to respective thicknesses of 5 nm and 100 nm and, subsequently, the layer was subjected to a patterning operation (see FIG. 6A).

A silicon nitride film was formed to a thickness of 200 nm as protective layer on a single crystal silicon wafer second substrate 12 having a crystal plane of (100). Thereafter, a polyimide film was formed as bonding layer 14 and then subjected to a patterning operation. Subsequently, the protective layer on the rear side was patterned to produce an intended pattern by photolithography and etching using an aqueous solution of hydrogen fluoride and ammonium fluoride and then the second substrate 12 and the surface protective layer were etched from the back side to produce through holes. Then, the first substrate 11 and the second substrate 12 were bonded to each other along the interface of the bonding layer 14 and the light blocking layer 8 by holding the two substrates together and heat treating them at 200° C. (see FIG. 6B). Subsequently, the first substrate 11 and the second substrate 12 were separated from each other by peeling them off from each other along the interface of the peeling layer 13 and the light blocking layer 8 in order to transfer the projection onto the second substrate 12.

Figure 6A:
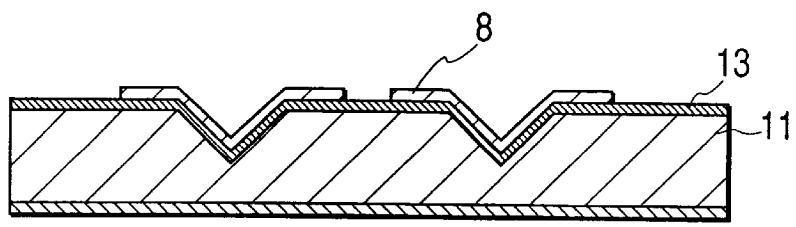
FIGS. 6A, 6B, 6C, 6D and 6E are schematic cross sectional views of a multi-probe having micro-apertures according to the invention and prepared in Example 3, showing different steps of forming micro-apertures.
Figure 6B:
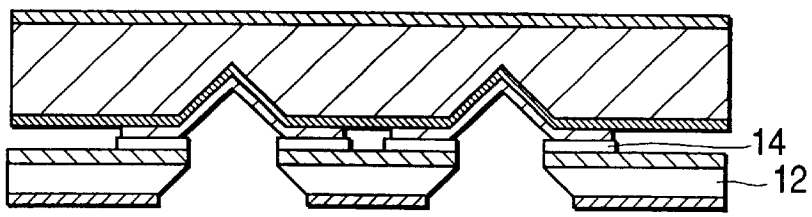
Figure 6C:
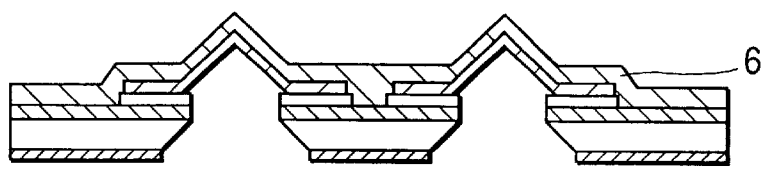

Thereafter, a film thickness controlling layer 6 was produced with a film thickness of 100 nm by forming a PSG film from the surface of the first substrate 11 at film forming temperature of 350° C. by chemical vapor deposition using TEOS (tetraethylorthosilicate), TMP (trimethylphosphate) and ozone (see FIG. 6C). Then, the film thickness controlling layer 6 was plastically deformed through heat treatment at 1,100° C. for 20 minutes to produce a film thickness distribution where the PSG was thinned at the tops.

Figure 6D:
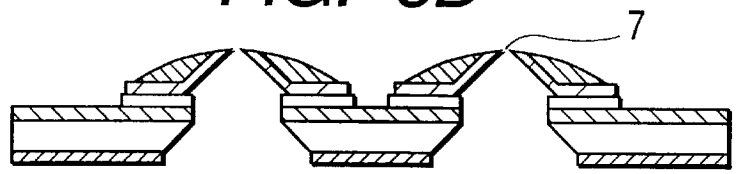
Figure 6E:
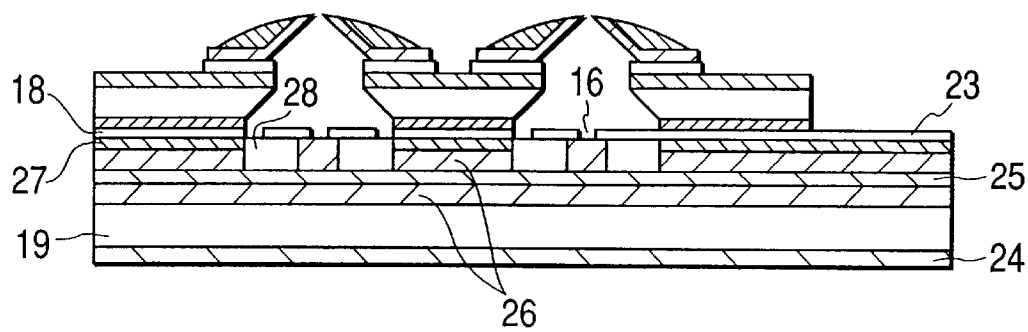

Subsequently, the film thickness controlling layer 6 and the light blocking layer 8 were etched to produce micro-apertures 7 at the top of the light blocking layer 8 by dry etching using carbon tetrafluoride (see FIG. 6D).

A third substrate 19 carrying thereon light emitting devices 16 of surface emitting laser arranged in the form of matrix and located at respective positions corresponding to the micro-apertures 7 of the second substrate 12 was prepared. The third substrate 19 is formed by arranging anodes 23, a cathode 24, an active layer 25, mirror layers 26, a silicon nitride layer 27 and a polyimide layer 28 on a substrate of gallium arsenide. The anodes 23 are connected to the respective light emitting devices 16 in order to drive the latter on a individual basis. The silicon nitride layer 27 is arranged to electrically insulate the anodes 23. The cathode 24 is a common electrode. As a voltage is applied between the anodes 23 and the cathode 24, laser beams generated in the active layer 25 are reflected by the upper and lower mirror layers 26 and emitted through the micro-apertures located thereabove. The third substrate 19 was then bonded to the second substrate 12 by means of epoxy resin 18 (FIG. 6E) to produce an optical multi-probe.

When the array of optical probes of the optical multi-probe of this example was used to expose photoresist with beams, a micro-pattern was formed by near-field light exposure with an enhanced rate of exposure.

Thus, according to the invention, a micro-aperture having a desired diameter can be formed with an enhanced degree of reproducibility by applying a film thickness controlling layer and an etching technique that are specific to the semiconductor process technology. Therefore, a plurality of projections having micro-apertures can be formed on a substrate with minimal variances in the diameter of the micro-apertures on a batch basis with a remarkably high productivity.

Additionally, according to the invention, a small size and large capacity optical memory can be realized by using a multi-probe of a plurality of probes having projections and micro-apertures.

Still additionally, according to the invention, a surface scanner can be realized with an enhanced degree of resolution by using a probe having a projection and a micro-aperture.

Furthermore, according to the invention, an aligner adapted to produce micro-patterns at an enhanced rate can be realized by using a probe having a projection and a micro-aperture.

Finally, according to the invention, an information processor adapted to minimize the bit size for recording data can be realized by using a probe having a projection and a micro-aperture.

What is claimed is:

1. A method of forming a micro-aperture comprising steps of:

forming a projection comprised of a thin film layer on a substrate, said projection having a tip;

forming a film thickness controlling layer on the surface of said projection so as to make the film thickness controlling layer thin at and near the tip of said projection; and etching said film thickness controlling layer and said thin film layer under the same conditions so that a portion of the film thickness controlling layer is removed to expose the tip of the projection hereafter continuing to etch both said layers to produce a micro-aperture at the tip.

2. A method according to claim 1, wherein said step of forming a projection comprises steps of:

forming a dent on a surface of said substrate, said dent having a bottom tip;

forming a thin film layer on the surface of said substrate including the surface of said dent; and selectively etching the substrate from the side opposite to the surface having the thin film layer to expose a portion of the thin film layer at and around the bottom tip, said portion of the thin film layer constituting said projection.

3. A method of forming a micro-aperture according to claim 1, wherein said film thickness controlling layer is formed by forming a film of a plastic material.

4. A method of forming a micro-aperture according to claim 3, wherein said plastic material is subsequently heat treated to produce a viscous flow of the material.

5. A method of forming a micro-aperture according to claim 3, wherein said plastic material is glass.

6. A method of forming a micro-aperture according to claim 3, wherein said plastic material is phospho-silicate glass.

7. A method of forming a micro-aperture according to claim 2, wherein the step of forming a dent on the surface of the substrate is carried out by forming an inverted-pyramid-shaped dent on a single crystal silicon substrate by crystal-axis-anisotropic etching.

8. A method according to claim 2, wherein said thin film layer is made of a light blocking material.

* * * * *

UNITED STATES PATENT AND TRADEMARK OFFICE
CERTIFICATE OF CORRECTION

PATENT NO. : 6,376,833 B2
DATED : April 23, 2002
INVENTOR(S) : Yasuhiro Shimada et al.

It is certified that error appears in the above-identified patent and that said Letters Patent is hereby corrected as shown below:

Column 2,
Line 42, "above described" should read -- above-described --;
Line 49, "cross sectional" should read -- cross-sectional --;
Line 53, "cross sectional" should read -- cross-sectional --;
Line 57, "cross sectional" should read -- cross-sectional --;
Line 59, "cross" should read -- cross- --;
Line 64, "cross sectional" should read -- cross-sectional --; and
Line 66, "cross" should read -- cross- --.

Column 4,
Line 14, "above described" should read -- above-described --;
Line 21, "above described" should read -- above-described --; and
Line 26, "above described" should read -- above-described --.

Column 5,
Line 22, "cross sectional" should read -- cross-sectional --; and
Line 24, "is" should be deleted.

Column 7,
Line 59, "cross sectional" should read -- cross-sectional --.

Signed and Sealed this

Ninth Day of July, 2002

Attest:

Attesting Officer

JAMES E. ROGAN
Director of the United States Patent and Trademark Office